(12) United States Patent
Fan

(10) Patent No.: US 8,179,389 B2
(45) Date of Patent: May 15, 2012

(54) COMPACT LAYOUT STRUCTURE FOR DECODER WITH PRE-DECODING AND SOURCE DRIVING CIRCUIT USING THE SAME

(75) Inventor: Wen-Teng Fan, Tainan County (TW)

(73) Assignee: Himax Technologies Limited, Tainan (TW)

( * ) Notice: Subject to any disclaimer, the term of this patent is extended or adjusted under 35 U.S.C. 154(b) by 865 days.

(21) Appl. No.: 12/121,300

(22) Filed: May 15, 2008

(65) Prior Publication Data

US 2009/0284512 A1    Nov. 19, 2009

(51) Int. Cl.
*G09G 5/00* (2006.01)

(52) U.S. Cl. ........ 345/211; 345/690; 345/204; 345/100; 341/144

(58) Field of Classification Search .................. 345/211, 345/212, 213, 690, 98, 99, 100, 204; 341/144
See application file for complete search history.

(56) References Cited

U.S. PATENT DOCUMENTS

| | | | | |
|---|---|---|---|---|
| 4,796,227 A | | 1/1989 | Lyon et al. | 365/154 |
| 5,059,978 A | * | 10/1991 | Valdenaire | 341/145 |
| 5,387,912 A | * | 2/1995 | Bowers | 341/118 |
| 6,344,814 B1 | | 2/2002 | Lin et al. | 341/144 |
| 6,844,839 B2 | * | 1/2005 | Lee et al. | 341/144 |
| 7,187,314 B1 | * | 3/2007 | Beamish et al. | 341/144 |
| 7,236,114 B2 | * | 6/2007 | Ahn | 341/144 |
| 7,265,697 B2 | * | 9/2007 | Tsai et al. | 341/144 |
| 7,382,344 B2 | * | 6/2008 | Lee et al. | 345/99 |
| 2007/0176813 A1 | * | 8/2007 | Nakayama et al. | 341/144 |
| 2007/0194964 A1 | * | 8/2007 | Chang et al. | 341/144 |

OTHER PUBLICATIONS

Chinese Examination Report of Taiwan Application No. 097122410, dated on Dec. 12, 2011.

* cited by examiner

*Primary Examiner* — Lun-Yi Lao
*Assistant Examiner* — Tom Sheng
(74) *Attorney, Agent, or Firm* — J.C. Patents

(57) ABSTRACT

Provided is a decoder for receiving a digital data and outputting an analog voltage. The decoder comprising a main switch array, a first pre-decoding switch array, and a second pre-decoding switch array. The main switch array receives the digital data and outputs a voltage if the digital data is in a first range. The first pre-decoding switch array is for receiving the digital data, pre-decoding a part of the digital data, and outputting a voltage if the digital data is in a second range. The second pre-decoding switch array is for receiving the digital data, pre-decoding the part of the digital data, and outputting a voltage if the digital data is in a third range. Combination of the main switch array, the first pre-decoding switch array, and the second pre-decoding switch array is in a substantially rectangular layout structure.

14 Claims, 10 Drawing Sheets

COMPACT LAYOUT STRUCTURE FOR DECODER WITH PRE-DECODING AND SOURCE DRIVING CIRCUIT USING THE SAME

BACKGROUND OF THE INVENTION

1. Field of Invention

The present invention relates to a decoder, and more particularly to a decoder having a compact layout.

2. Description of Related Art

Various types of electronic devices have display devices, such as TVs, laptop computers, monitors and mobile communication terminals. The display devices are requested to be thin and light in order to save the volume and the cost of the electronic devices. To satisfy these requirements, various Flat Panel Displays (FPDs) have been developed as alternatives to the more conventional cathode ray tube displays.

A Liquid Crystal Display (LCD) is one kind of Flat Panel Display. The image data is input to a timing controller of the LCD, and then transmitted to a source driver. The source driver generates driving voltages corresponding to the image data for driving the LCD to display an image.

The color depth of a LCD is, for example, 6-bits (i.e. each of the Red, Green, Blue data have 6 bits), or 8-bits (i.e. each of the Red, Green, Blue data have 8 bits). The source driver should therefore have higher resolution if the color depth is higher.

However, increasing the resolution of a source driver increases cost. In particular, a digital-to-analog converter for converting input digital data to analog driving voltages is built in the source driver. Because the number of transistors included in a digital-to-analog converter (DAC) increases greatly according as the resolution increases, the higher resolution, the larger the DAC.

FIG. 1 shows a circuit diagram illustrating a conventional DAC. As illustrated in FIG. 1, the digital-to-analog converter 100 includes a full-type decoder 110 which receives 10-bit digital data to select one of gamma voltages based on the 10-bit digital data. The gamma voltages, which spread between the VA and the VS voltage levels, have total 1024 gamma voltages with 1024 voltage levels V0-V1023.

The decoder 110 receives 10-bit input digital data, i.e. bits D0, D1, D2, D3, D4, D5, D6, D7, D8, and D9, and inverted bits, i.e. D0B, D1B, D2B, D3B, D4B, D5B, D6B, D7B, D8B, and D9B, and the decoder 110 selects one gamma voltage among the gamma voltages V0, V1, V2, . . . , V1022, V1023 based on the 10-bit input digital data.

The decoder 110 includes 1024 transistor rows 111 respectively corresponding to gamma voltages V0, V1, V2 . . . V1022, and V1023. Each of the 1024 transistor rows 111 includes ten transistors connected in series, and each of the transistors receives one bit or inverted bit of the input digital data.

For example, while the input digital data are '0000000001', the gamma voltage V1 will be output, because the gate of the corresponding transistor M10 is connected to D0, and the gates of the corresponding transistors M11-M19 are connected to the inverted signals D1B to D9B. The selected gamma voltage V1 is then output to the LCD.

However, a full-type decoder may occupy a very large chip area. For example, a 10-bit full-type decoder requires 1024 (i.e. $2^{10}$) transistor rows 111, which have a large number (10×1024=10240) of transistors. Further, a 12-bit fall-type decoder requires 4096 transistor rows, which have 12×4096=49152 transistors, 4 times more than that of a 10-bit fall-type decoder.

SUMMARY OF THE INVENTION

The invention provides a decoder for receiving a digital data and outputting an analog voltage and a source driver using the same, for reducing circuit area and power consumption.

One example of the invention provides a decoder using a layout structure with pre-decoding, the decoder has: a main switch array for receiving digital data and outputting a voltage if the digital data is in a first range, and the main switch array having switches arranged in rows and columns; a first pre-decoding switch array for receiving the digital data, pre-decoding a part of the digital data, and outputting a voltage if the digital data is in a second range, and the first pre-decoding switch array having switches arranged in rows and columns; and a second pre-decoding switch array for receiving the digital data, pre-decoding the part of the digital data, and outputting a voltage if the digital data is in a third range, and the second pre-decoding switch array having switches arranged in rows and columns; wherein combination of the main switch array, the first pre-decoding switch array and the second pre-decoding switch array is in a substantially rectangular layout structure.

Further, an amount of switches in each row of the main switch array is N0, an amount of switches in each row of the first pre-decoding switch array is N1, and an amount of switches in each row of the second pre-decoding switch array is N2. According to an embodiment of the invention, N0=N1+N2, and N0, N1 and N2 are positive integers.

Thus, the decoder has compact layout structure with rectangular figure. By the compact layout structure with rectangular figure, the power consumption and the die area of the decoder is decreased.

Another example of the invention provides a digital-to-analog converter of a source driver of a display, the digital-to-analog converter has a decoder, the decoder being for generating a plurality of gamma voltages, for representing a plurality of gray scales, and for generating an analog gray scale voltage. Wherein the decoder further has: a main switch array for receiving digital data and outputting a voltage if the digital is in a first range, the main switch array having switches arranged in rows and columns, the main switch array being in a substantially rectangular layout structure; a first pre-decoding switch array for receiving the digital data, pre-decoding a part of the digital data, and outputting a voltage if the digital data is in a second range, the first pre-decoding switch array having switches arranged in rows and columns, the first pre-decoding switch array being in a substantially rectangular layout structure; and a second pre-decoding switch array for receiving the digital data, pre-decoding the part of the digital data, and outputting a voltage if the digital data is in a third range, the second pre-decoding switch array having switches arranged in rows and columns, the second pre-decoding switch array being in a substantially rectangular layout structure. Combination of the main switch array, the first pre-decoding switch array and the second pre-decoding switch array is in a substantially rectangular layout structure.

Further, an amount of switches in each row of the main switch array, an amount of switches in each row of the first pre-decoding switch array, and an amount of switches in each row of the second pre-decoding switch array are N0, N1, and N2 respectively. In accordance with an embodiment of the invention, N0=N1+N2, and N0, N1 and N2 are positive integers.

Thus, the source driver has compact layout structure with rectangular figure for the decoder. By the compact layout structure with rectangular figure, the power consumption and the die area of the source driver is decreased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
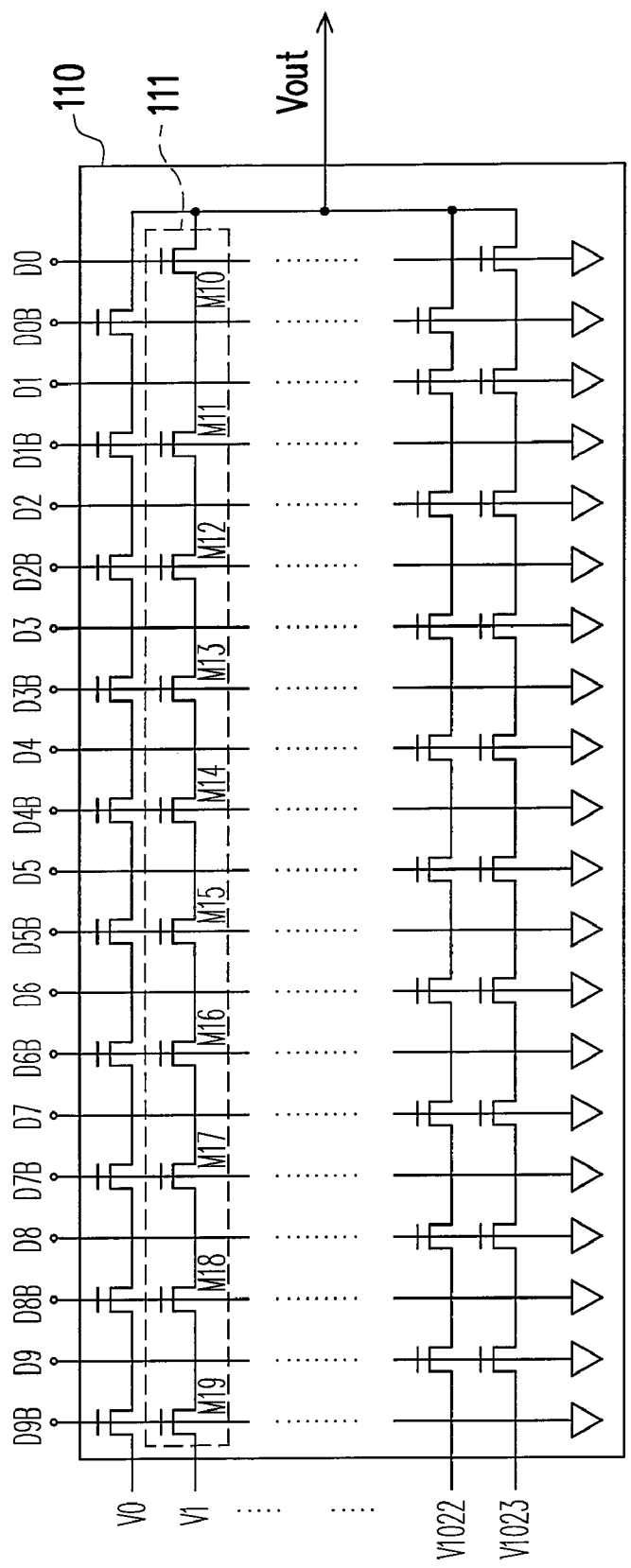
FIG. 1 shows a circuit diagram illustrating a conventional digital-to-analog converter having a full-type decoder.

Reference will now be made in detail to the present embodiments of the invention, examples of which are illustrated in the accompanying drawings. Wherever possible, the same reference numbers are used in the drawings and the description to refer to the same or like parts.

Figure 2:
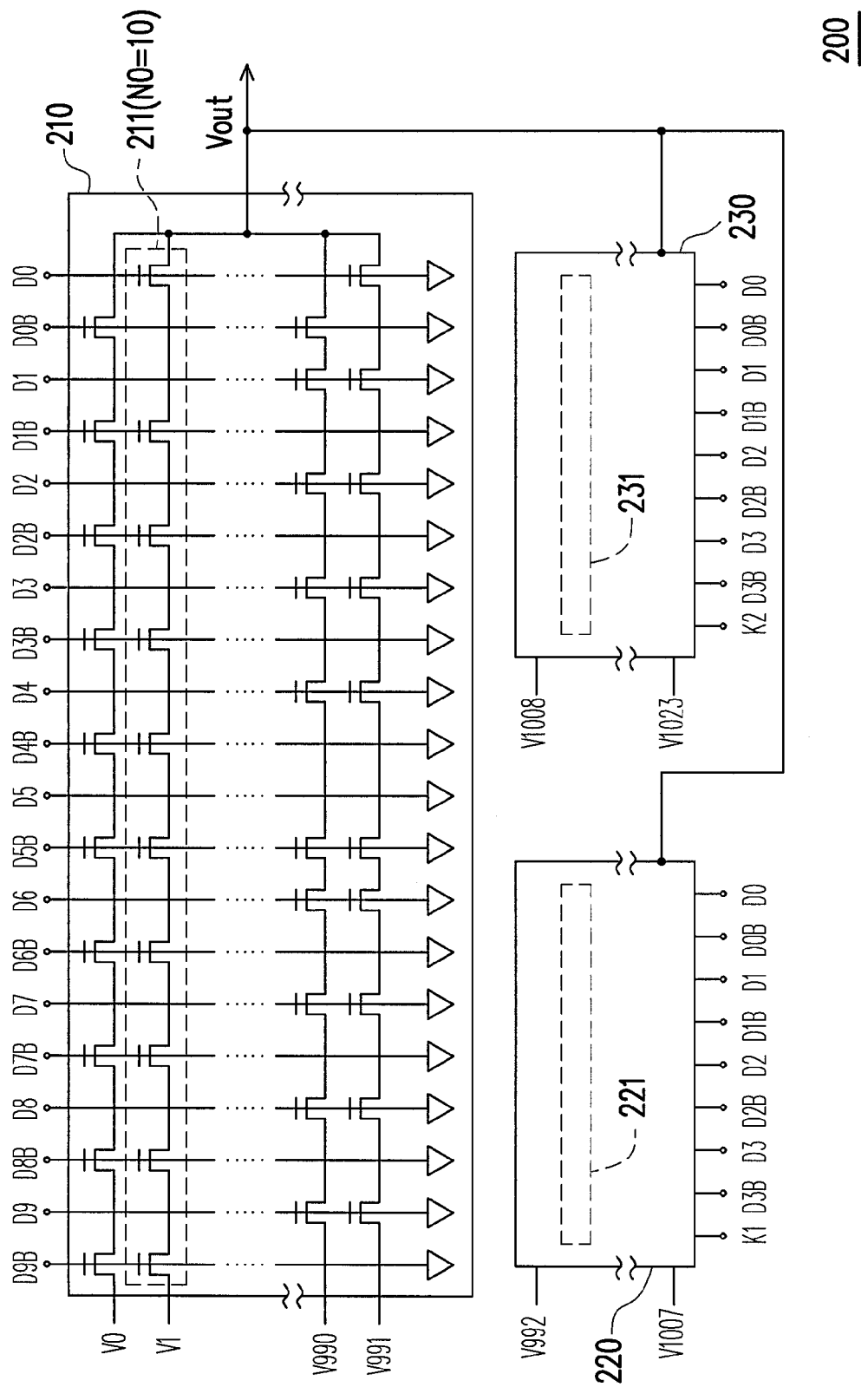
FIG. 2 shows a decoder using a layout structure with pre-decoding according to an embodiment of the invention.

FIG. 2 shows a decoder using a layout structure with pre-decoding according to an embodiment of the invention. The decoder 200 selects one of the gamma voltages V0-V1023 based on the input digital data D0-D9 and D0B-D9B. The decoder 200 includes a main switch array 210, a first pre-decoding switch array 220, and a second pre-decoding switch array 230. The main switch array 210 is a full-type decoder for selecting one of the gamma voltages V0-V991; the first pre-decoding switch array 220 is used for selecting one of the gamma voltages V992-V1007; the second pre-decoding switch array 230 is used for selecting one of the gamma voltages V1008-V1023.

Figure 3:
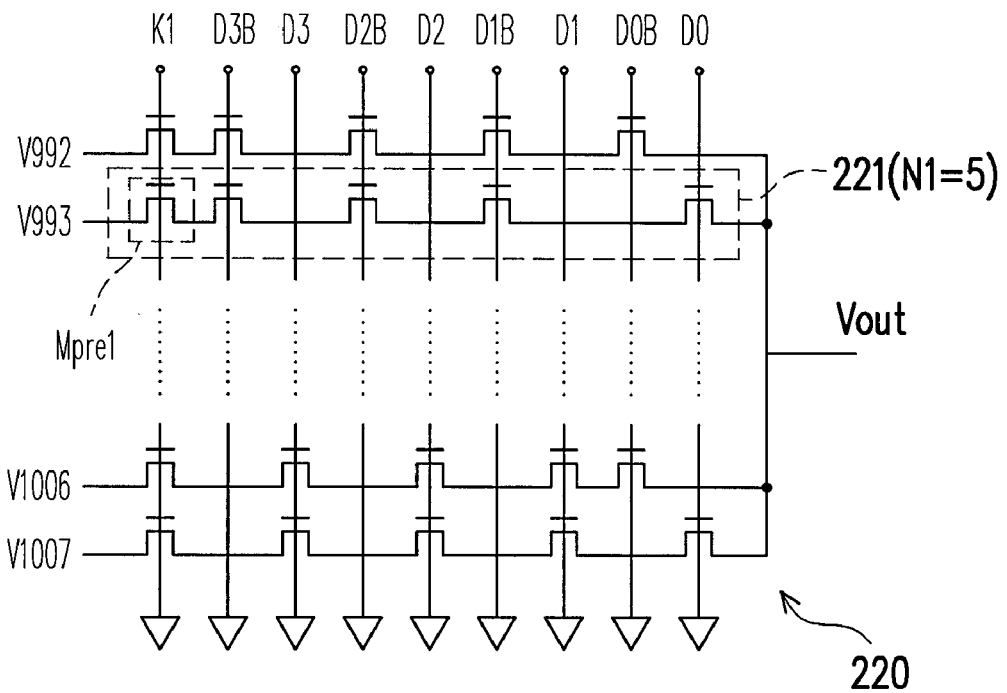
FIG. 3 shows a first pre-decoding switch array using a layout structure.
Figure 4:
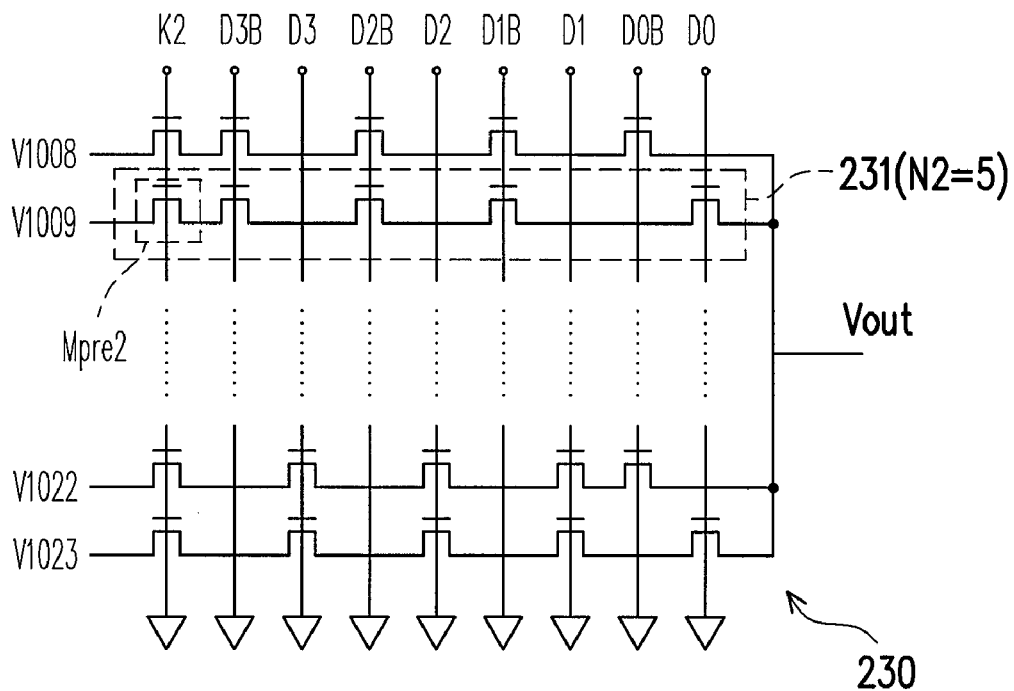
FIG. 4 shows a second pre-decoding switch array using a layout structure.

FIG. 3 shows the first pre-decoding switch array 220 using a layout structure. The first pre-decoding switch array 220 has switches arranged in rows and columns for pre-decoding. FIG. 4 shows the second pre-decoding switch array 230 using a layout structure. The second pre-decoding switch array 230 has switches arranged in rows and columns for pre-decoding.

The decoder 200 receives, for example, 10-bit digital data to select one of gamma voltages V0, V1, V2 . . . V1022, and V1023 based on the 10-bit digital data. The gamma voltages V0, V1, V2 . . . V1022, and V1023 spread between the voltages VS and VA. The input digital data include bit values D0, D1, D2, D3, D4, D5, D6, D7, D8, and D9 and/or inverted values of each of the bit values, i.e. D0B, D1B, D2B, D3B, D4B, D5B, D6B, D7B, D8B, and D9B.

The main switch array 210 includes 992 transistor rows 211 respectively corresponding to the gamma voltages V0, V1, V2 . . . V990, and V991 so as to select one of the corresponding gamma voltages based on the received digital data. Each of the 992 transistor rows 211 includes ten transistors connected in series. The corresponding bit values of the input 10-bit digital data, or the corresponding inverted bit values thereof, are respectively input into the gate of each of the ten transistors.

The main switch array 210 is used as a digital-to-analog converter for outputting a gamma voltage based on the digital data from 0000000000 to 1111011111. For example, when the digital data '0000000001' are input into the main switch array 210, the gamma voltage V1 is selected by the main switch array 210 and output as Vout. Similarly, in the case where digital data '1111011111' are input into the main switch array 210, the gamma voltage V991 is selected by the main switch array 210 and output as Vout.

Figure 5:
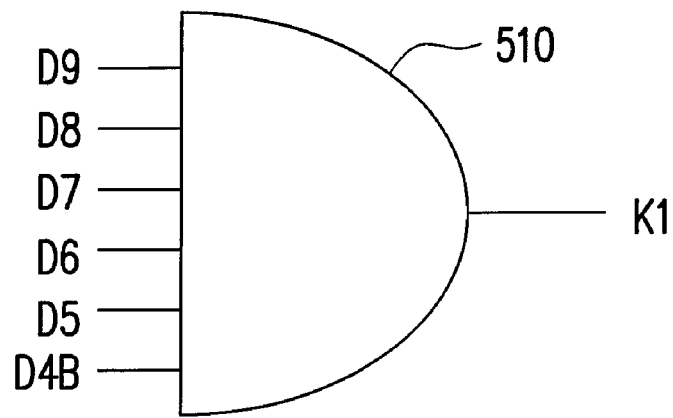
FIG. 5 shows a diagram of a pre-decoder for receiving part of the input digital data and generating a pre-decoded signal.

The first pre-decoding switch array 220 of the decoder 200 includes sixteen transistor rows 221 respectively corresponding to the gamma voltages V992, V993, . . . , V1006, and V1007 based on the input data digital data with MSB (Most Significant Bits) of '111110'. The first pre-decoding switch array 220 selects one of the gamma voltages V992, V993 . . . , V1006, and V1007 based on the received digital data and a pre-decoded signal K1. Each of the sixteen transistor rows 221 includes a first pre-decoding transistor Mpre1 and four transistors connected in series. The pre-decoded signal K1 is received by the gate of the first pre-decoding transistor Mpre1. FIG. 5 shows a diagram of a pre-decoder 510 for receiving part of the input digital data (MSB in this embodiment) and generating the pre-decoded signal K1. The pre-decoder 510 is exemplified by an AND gate. In this embodiment, the digital data D4B, D5, D6, D7, D8, and D9 are input into the pre-decoder 510. When the digital data D4B, D5, D6, D7, D8, and D9 are all at '1' status, the pre-decoded signal K1 is set to '1' status, else the pre-decoded signal K1 is set to '0' status.

Therefore, through the pre-decoder 510, the first pre-decoding switch array 220 only works when the digital data D4B, D5, D6, D7, D8, and D9 are all at '1' status. Referring to FIG. 2 and FIG. 3, each of the sixteen transistor rows 221 has five transistors (the first pre-decoding transistor Mpre1 and four transistors) connected in series. The pre-decoded signal K1 and the four corresponding bit values of the input digital data, i.e. D0, D1, D2, and D3, or D0B, D1B, D2B, and D3B, are respectively input into the gate of each of the five transistors of the sixteen transistor rows 221.

Therefore the first pre-decoding switch array 220 is used as a digital-to-analog converter for outputting a gamma voltage based on the digital data from 1111100000 to 1111101111. For example, when the digital dada '1111100001' are input into the first pre-decoding switch array 220, the gamma voltage V993 is selected by the first pre-decoding switch array 220 and output as Vout. In another example, when the digital data '1111101111' are input into the first pre-decoding switch array 220, the gamma voltage V1007 is selected by the first pre-decoding switch array 220 and output as Vout.

Figure 6:
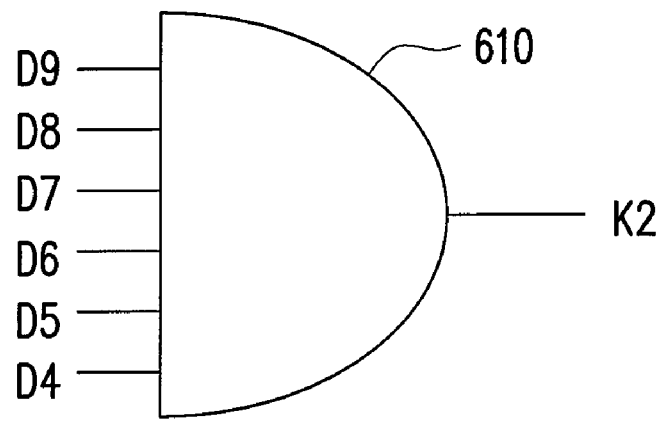
FIG. 6 shows a diagram of a pre-decoder for receiving part of the input digital data and generating a pre-decoded signal.

The second pre-decoding switch array 230 of the decoder 200 includes sixteen transistor rows 231 respectively corresponding to the gamma voltages V1008, V1009, . . . , V1022, and V1023 based on the input data digital data with MSB (Most Significant Bits) of '111111'. The second pre-decoding switch array 230 selects one of the gamma voltages V1008, V1009, . . . , V1022, and V1023 based on the received digital data and a pre-decoded signal K2. Each of the transistor rows 231 includes a second pre-decoding transistor Mpre2 and four transistors connected in series. The pre-decoded signal K2 is received by the gate of the second pre-decoding transistor Mpre2. FIG. 6 shows a diagram of a pre-decoder 610 for receiving part of the input digital data (MSB in this embodiment) and generating the pre-decoded signal K2. The pre-decoder 610 is exemplified by an AND gate. In this embodiment, the digital data D4, D5, D6, D7, D8, and D9 are input into the pre-decoder 610. When the digital data D4, D5, D6, D7, D8, and D9 are all at '1' status, the pre-decoded signal K2 is set to '1' status, else the pre-decoded signal K2 is set to '0' status.

Therefore, through the pre-decoder 610, the second pre-decoding switch array 230 only works when the digital data D4, D5, D6, D7, D8, and D9 are all at '1' status. Referring back to FIG. 2 and FIG. 4, each of the sixteen transistor rows 231 has five transistors (the second pre-decoding transistor Mpre2 and four transistors) connected in series. The pre-decoded signal K2 and the four corresponding bit values of the input digital data, i.e. D0, D1, D2, and D3, or D0B, D1B, D2B, and D3B, are respectively input into the gate of each of the five transistors of the sixteen transistor rows 231.

Therefore the second pre-decoding switch array 230 is used as a digital-to-analog converter for outputting a gamma voltage based on the digital data through 1111110000 to 1111111111. For example, when the digital data '1111110001' are input into the second pre-decoding switch array 230, the gamma voltage V1009 is selected by the second pre-decoding switch array 230 and output as Vout. In another example, when the digital data '1111111111' are input into the second pre-decoding switch array 230, the gamma voltage V1023 is selected by the second pre-decoding switch array 230 and output as Vout.

Hence, the main switch array 210, the first pre-decoding switch array 220, and the second pre-decoding switch array 230 are together used as a 10-bit digital-to-analog converter. The bit number of the digital data can be changed for the designer or other purpose, so the bit number of the digital data can not limit this invention.

Referring to FIG. 2, FIG. 3, and FIG. 4 together, the layout structure of the decoder 200 can be very compact and be a rectangular because the main switch array 210 has a width of ten transistors in the row direction, and the first pre-decoding switch array 220 and the second pre-decoding switch array 230 each has a width of five transistors in the row direction. Thus the width of the decoder 200 corresponds to ten transistors and the length of the decoder 200 corresponds to 992+16=1008 transistor rows. The chip area of the decoder 200 is reduced compared to the conventional full-type decoder in FIG. 1, which has a length of 1024 transistor rows.

Figure 7A:
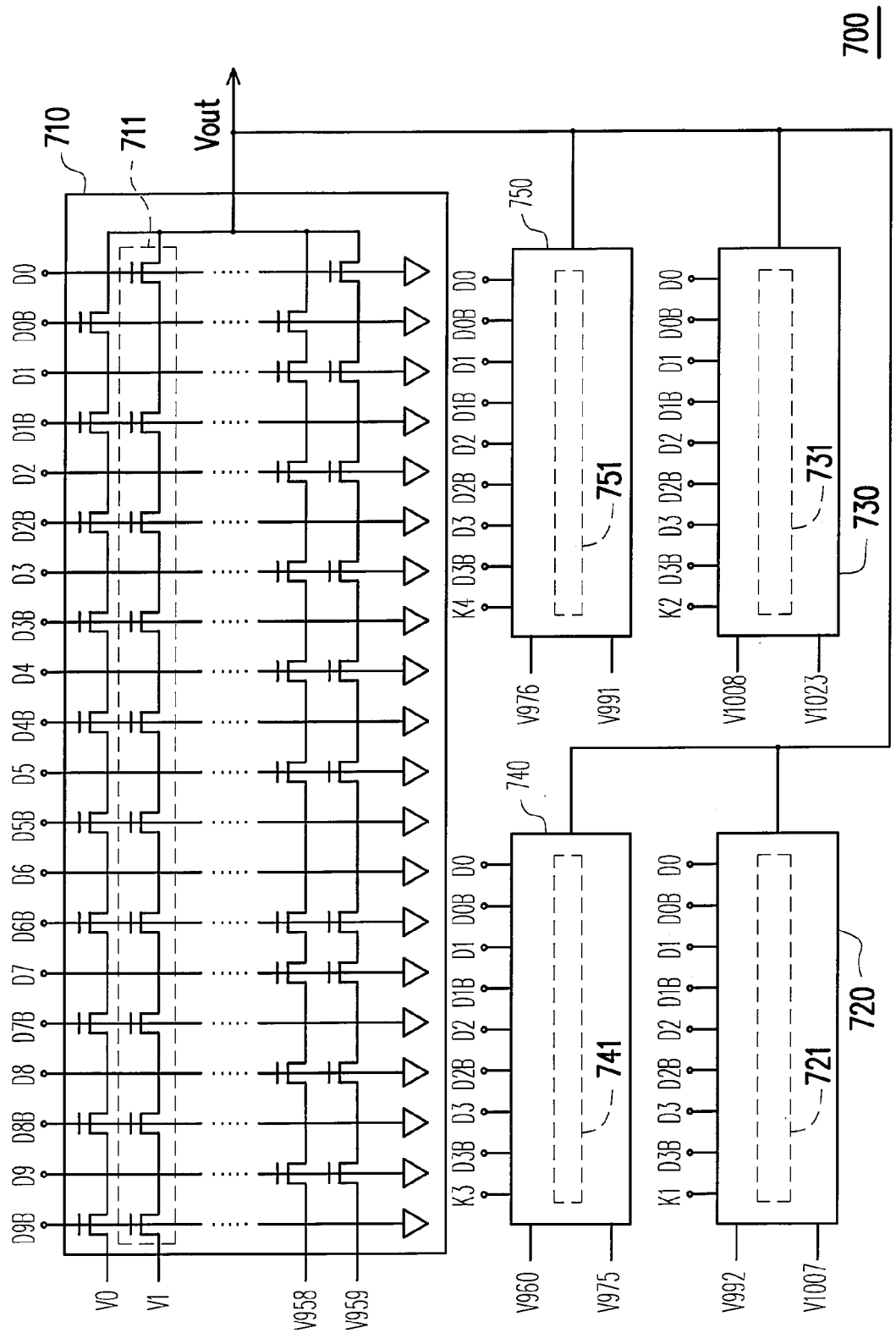
FIG. 7A shows a decoder using a layout structure with pre-decoding according to another embodiment of the invention.

Besides, other possible decoders using layout structures with pre-decoding are disclosed in other embodiments of the invention. FIG. 7A shows a decoder using a layout structure with pre-decoding according to another embodiment of the invention. The decoder 700 selects one of the gamma voltages V0-V1023 based on the input digital data D0-D9 and D0B-D9B. The decoder 700 includes a main switch array 710, a first pre-decoding switch array 720, a second pre-decoding switch array 730, a third pre-decoding switch array 740, and a fourth pre-decoding switch array 750.

The decoder 700 receives, for example, 10-bit digital data to select one of gamma voltages V0, V1, V2 . . . V1022, and V1023 based on the 10-bit digital data. The gamma voltages V0, V1, V2 . . . V1022, and V1023 spread between the voltages VS and VD. The input digital data include bit values D0, D1, D2, D3, D4, D5, D6, D7, D8, and D9 and/or inverted values of each of the bit values, i.e. D0B, D1B, D2B, D3B, D4B, D5B, D6B, D7B, D8B, and D9B.

The main switch array 710 is a full-type decoder for selecting one of the gamma voltages V0-V959; the first pre-decoding switch array 720 is used for selecting one of the gamma voltages V992-V1007 based on the input digital data having MSB of '111110'; the second pre-decoding switch array 730 is used for selecting one of the gamma voltages V1008-V1023 based on the input digital data having MSB of '111111'; the third pre-decoding switch array 740 is used for selecting one of the gamma voltages V960-V975 based on the input digital data having MSB of '111100'; the fourth pre-decoding switch array 750 is used for selecting one of the gamma voltages V976-V991 based on the input digital data having MSB of '111101'.

The main switch array 710 of the layout structure 700 includes 960 transistor rows 711 respectively corresponding to the gamma voltages V0, V1, V2 . . . V958, V959 so as to select one of the corresponding gamma voltages based on the received digital data. Each of the 960 transistor arrays 711 includes ten transistors connected in series. The corresponding bit values of the input 10-bit digital data, or the corresponding inverted bit values thereof, are respectively input into the gate of each of the ten transistors.

The main switch array 710 is used as a digital-to-analog converter for outputting a gamma voltage based on the digital data from 0000000000 to 1111001111. For example, when the digital data '0000000001' are input into the main switch array 710, the gamma voltage V1 is selected by the main switch array 710 and output as Vout. Similarly, in the case where digital data '1111001111' are input into the main switch array 710, the gamma voltage V959 is selected by the main switch array 710 and output as Vout.

The first pre-decoding switch array 720 and the second pre-decoding switch array 730 of the decoder 700 are respectively the same as the first pre-decoding switch array 220 and the second pre-decoding switch array 230. So the digital data from 1111100000 to 1111101111 can be converted into the gamma voltages V992~V1007 by the first pre-decoding switch array 720, and the digital data from 1111110000 to 1111111111 can be converted into the gamma voltages V1008~V1023 by the second pre-decoding switch array 730.

Figure 7B:
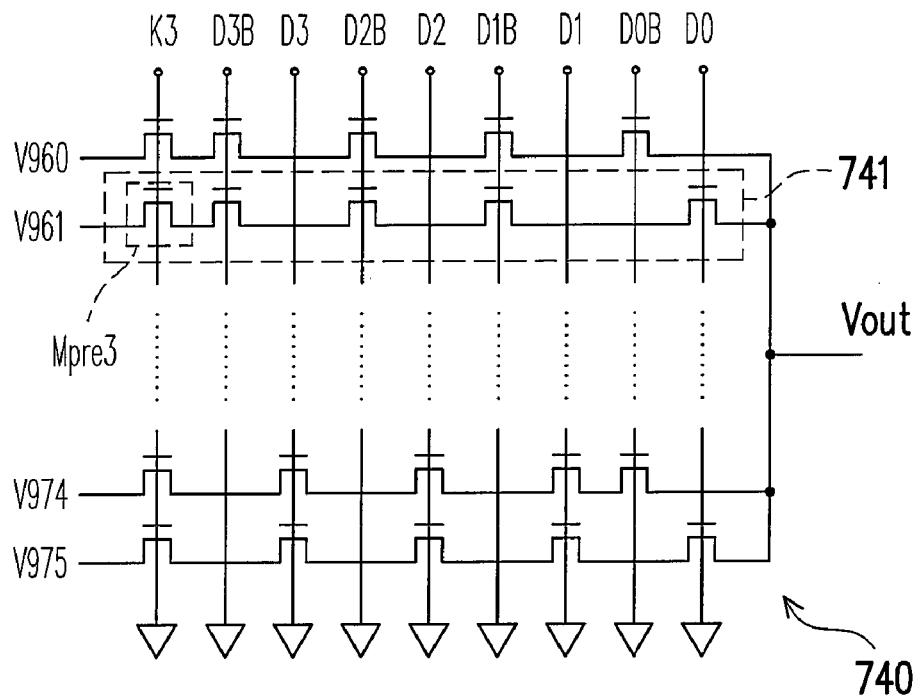
FIG. 7B shows a third pre-decoding switch array using a layout structure.
Figure 7C:
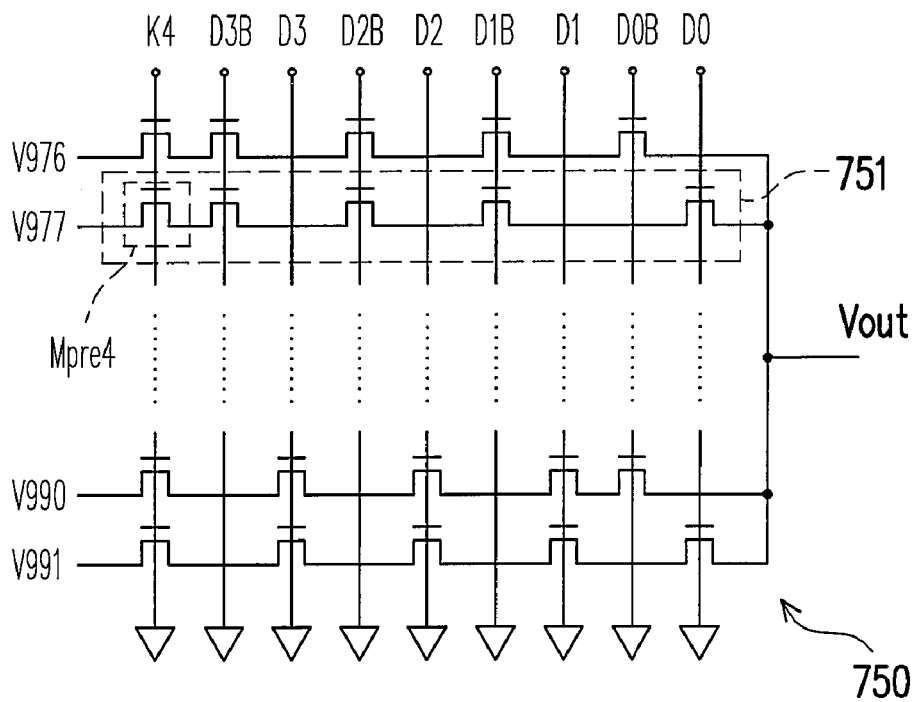
FIG. 7C shows a fourth pre-decoding switch array using a layout structure.

FIG. 7B shows the third pre-decoding switch array 740 using a layout structure, and FIG. 7C shows the fourth pre-decoding switch array 750 using a layout structure. The third pre-decoding switch array 740 and the fourth pre-decoding switch array 750 are also analog to the first pre-decoding switch array 210 and the second pre-decoding switch array 220 respectively except a pre-decoded signal K3 and a pre-decoded signal K4. The third pre-decoding switch array 740 of the decoder 700 includes sixteen transistor rows 741 respectively corresponding to the gamma voltages V960-V975, and the fourth pre-decoding switch array 750 of the decoder 700 includes sixteen transistor rows 751 respectively corresponding to the gamma voltages V976-V991.

Figure 7D:
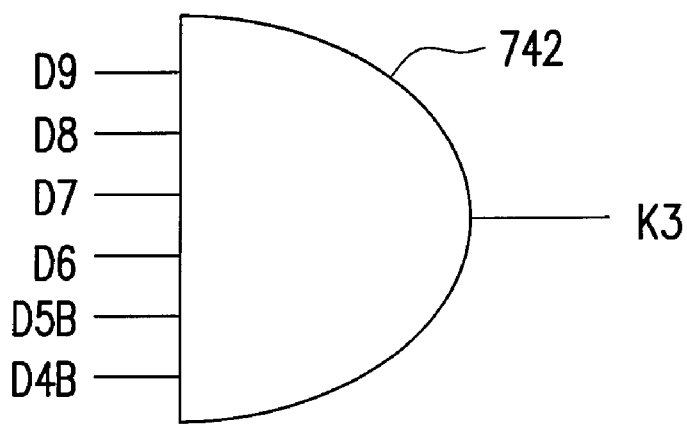
FIG. 7D shows a diagram of a pre-decoder for receiving part of the input digital data and generating a pre-decoded signal.
Figure 7E:
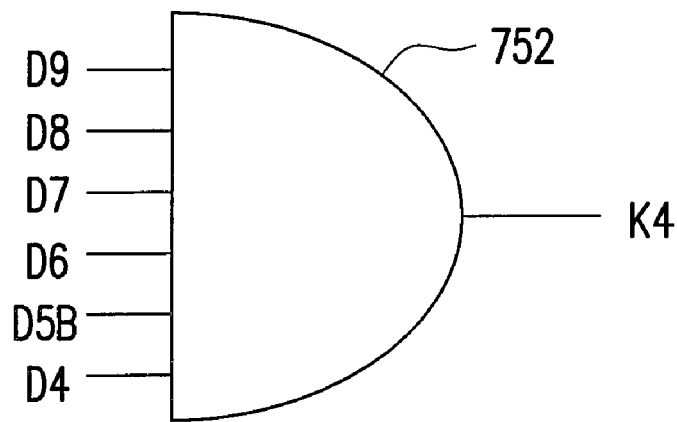
FIG. 7E shows a diagram of a pre-decoder for receiving part of the input digital data and generating a pre-decoded signal.

FIG. 7D and FIG. 7E show a diagram of a pre-decoder 742 and a diagram of a pre-decoder 752 for receiving part of the input digital data (MSB in this embodiment) and generating the pre-decoded signals K3 and K4 respectively. The pre-decoders 742 and 752 are exemplified by AND gates. In this embodiment, the digital data D4B, D5B, D6, D7, D8, and D9 are input into the pre-decoder 742. When the digital data D4B, D5B, D6, D7, D8, and D9 are all at '1' status, the pre-decoded signal K3 is set to '1' status, else the pre-decoded signal K3 is set to '0' status. The digital data D4, D5B, D6, D7, D8, and D9 are input into the pre-decoder 752. When the digital data D4, D5B, D6, D7, D8, and D9 are all at '1' status, the pre-decoded signal K4 is set to '1' status, else the pre-decoded signal K4 is set to '0' status.

Referring back to FIG. 7A and FIG. 7B, each of the sixteen transistor rows 741 has 5 transistors (a third pre-decoding transistor Mpre3 and four transistors) connected in series. Identically, referring to FIG. 7A and FIG. 7C, each of the sixteen transistor rows 751 has 5 transistors (a fourth pre-decoding transistor Mpre4 and four transistors) connected in series.

Referring to FIG. 7A, FIG. 7B, and FIG. 7C together, the layout of the decoder 700 can be very compact and be a rectangular because the main switch array 710 has a width of ten transistors in the row direction, the first pre-decoding switch array 720 and the second pre-decoding switch array 730 each has a width of five transistors in the row direction, and the third pre-decoding switch array 740 and the fourth pre-decoding switch array 750 each has a width of five transistors in the row direction. Thus the width of the decoder 700 corresponds to ten transistors and the length of the decoder 700 corresponds to 960+16+16=992 transistor rows. The chip area of the decoder 700 is reduced compared to the conventional full-type decoder in FIG. 1, which has a length of 1024 transistor rows.

Figure 8:
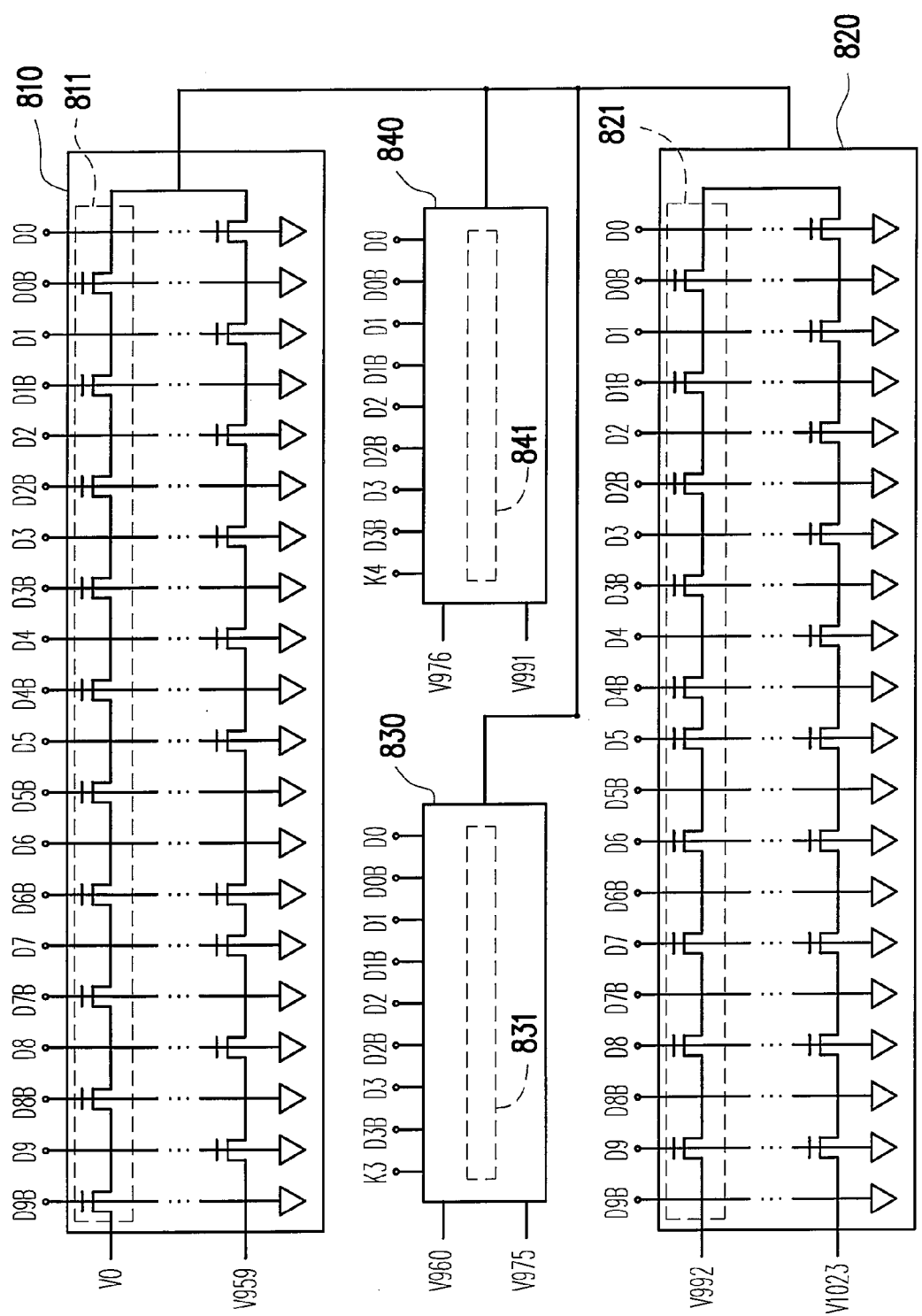
FIG. 8 shows a decoder using a layout structure with pre-decoding according to still another embodiment of the invention.

In addition, the decoder with pre-decoding can use other possible layout structure. FIG. 8 shows a decoder using a layout structure with pre-decoding according to still another embodiment of the invention. The decoder 800 includes a first main switch array 810, a second main switch array 820, a first pre-decoding switch array 830, and a second pre-decoding switch array 840.

The decoder 800 receives, for example, 10-bit digital data to select one of gamma voltages V0, V1, V2 . . . V1022, and V1023 based on the 10-bit digital data. The gamma voltages V0, V1, V2 . . . V1022, and V1023 spread between the voltages VS and VS. The input digital data include bit values D0, D1, D2, D3, D4, D5, D6, D7, D8, and D9 and/or inverted values of each of the bit values, i.e. D0B, D1B, D2B, D3B, D4B, D5B, D6B, D7B, D8B, and D9B.

The first main switch array 810 is a full-type decoder for selecting one of the gamma voltages V0-V959; the second main switch array 820 is a full-type decoder for selecting one of the gamma voltages V992-V1023; the first pre-decoding switch array 830 is used for selecting one of the gamma voltages V960-V975; the second pre-decoding switch array 840 is used for selecting one of the gamma voltages V976-V991.

Referring to FIG. 8, the first main switch array 810 is the same as or analog to the main switch array 710. For example, the first main switch array 810 includes 960 transistor rows 811 respectively corresponding to the gamma voltages V0, V1, V2 . . . V958, V959, so the digital data from 0000000000 to 1111001111 can be converted into the gamma voltages V0~V959 by the first main switch array 810.

The second main switch array 820 is also analog to the main switch array 710 but converting the input digital data to different gamma voltages. The second main switch array 820 of the decoder 800 includes 32 MOS transistor rows 821 respectively corresponding to gamma voltages V992, V993 . . . V1022, and V1023 so as to select one of the corresponding gamma voltages based on the received digital data. Each of the 32 transistor rows 821 includes ten transistors connected in series. The corresponding bit values of the input 10-bit digital data, or the corresponding inverted bit values thereof, are respectively input into the gate of each of the ten transistors. So the digital data from 1111100000 to 1111111111 can be converted into the gamma voltages V992~V1023 by the second main switch array 820.

The first pre-decoding switch array 830 and the second pre-decoding switch array 840 are the same as the third pre-decoding switch array 740 and the fourth pre-decoding switch array 750. So the digital data from 1111000000 to 1111001111 can be converted into the gamma voltages V960-V975 by the first pre-decoding switch array 830, and the digital data from 1111010000 to 1111011111 can be converted into the gamma voltages V976-V991 by the second pre-decoding switch array 840.

Referring to FIG. 8, the layout of the decoder 800 can be very compact and be a rectangular because the first main switch array 810 has a width of ten transistors in the row direction, the first pre-decoding switch array 830 and the second pre-decoding switch array 840 each has a width of five transistors in the row direction, and the second main switch array 820 has a width of ten transistors in the row direction. Thus the width of the decoder 800 corresponds to ten transistors and the length of the decoder 800 corresponds to 960+16+32=1008 transistor rows. The chip area of the decoder 800 is reduced compared to the conventional full-type decoder 100 in FIG. 1, which has a length of 1024 transistor rows.

Figure 9:
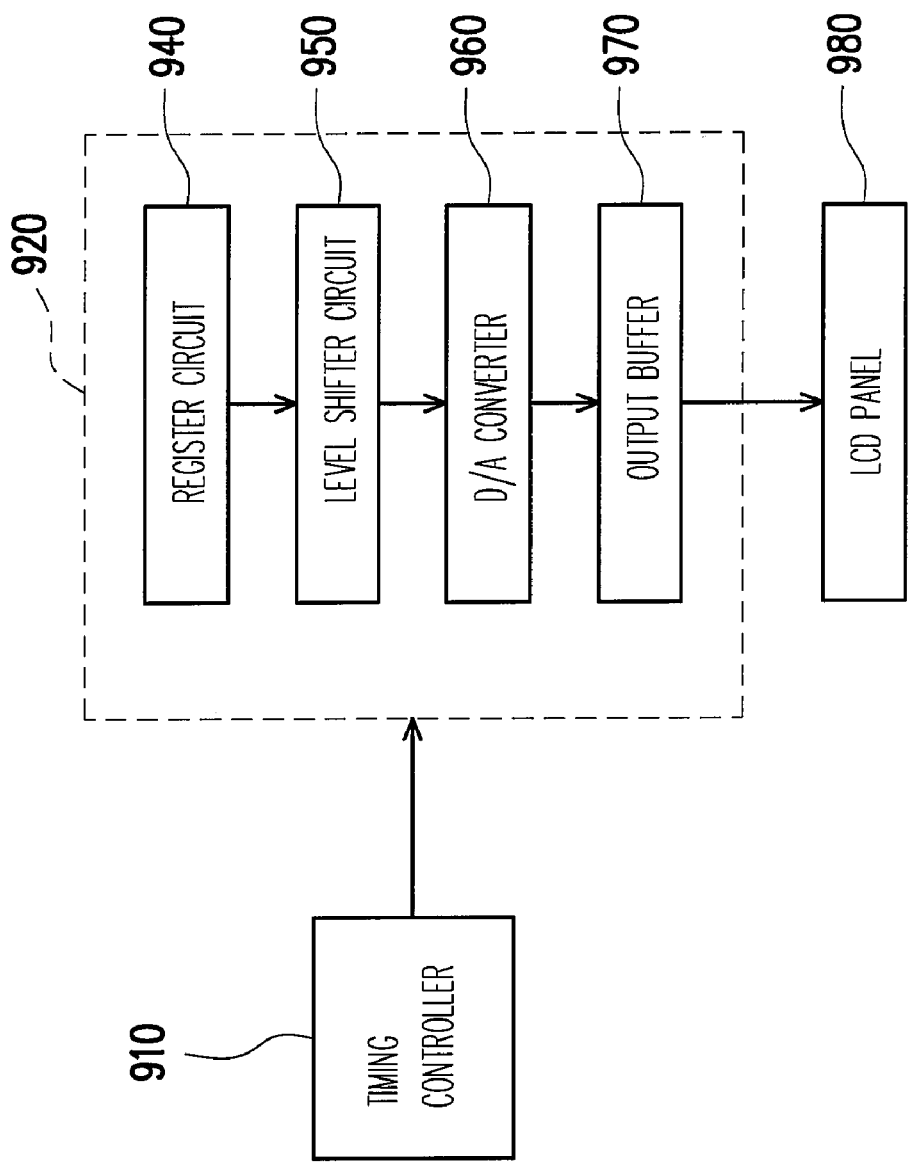
FIG. 9 shows a diagram of a display according to an embodiment of the invention.

FIG. 9 shows a diagram of a display according to an embodiment of the invention. The display 900 includes a timing controller 910, a source driver 920 and a LCD panel 980. The timing controller 910 outputs control signals and digital data to the source driver 920. The source driver 920 includes a register circuit 940, a level shifter circuit 950, a digital-to-analog converter 960, and an output buffer 970.

The register circuit 940 stores the digital data applied from the timing controller 910. Because the register circuit 940 and the digital-to-analog converter 960 operate at low voltage and at high voltage respectively, the level shifter circuit 950 transforms the voltage level of the outputs of the register circuit 940 so that the digital data provided from the register circuit 940 can be input to the digital-to-analog converter 960.

The digital-to-analog converter 960 generates gamma voltages and receives digital data which are level-shifted through the level shifter circuit 950, and then outputs analog gray scale voltages by selecting an appropriate gamma voltage based on the digital data. The output buffer 970 amplifies the analog gray scale voltages from the digital-to-analog converter 960 and outputs the amplified analog gray scale voltages to the data lines of a LCD panel 980.

Figure 10:
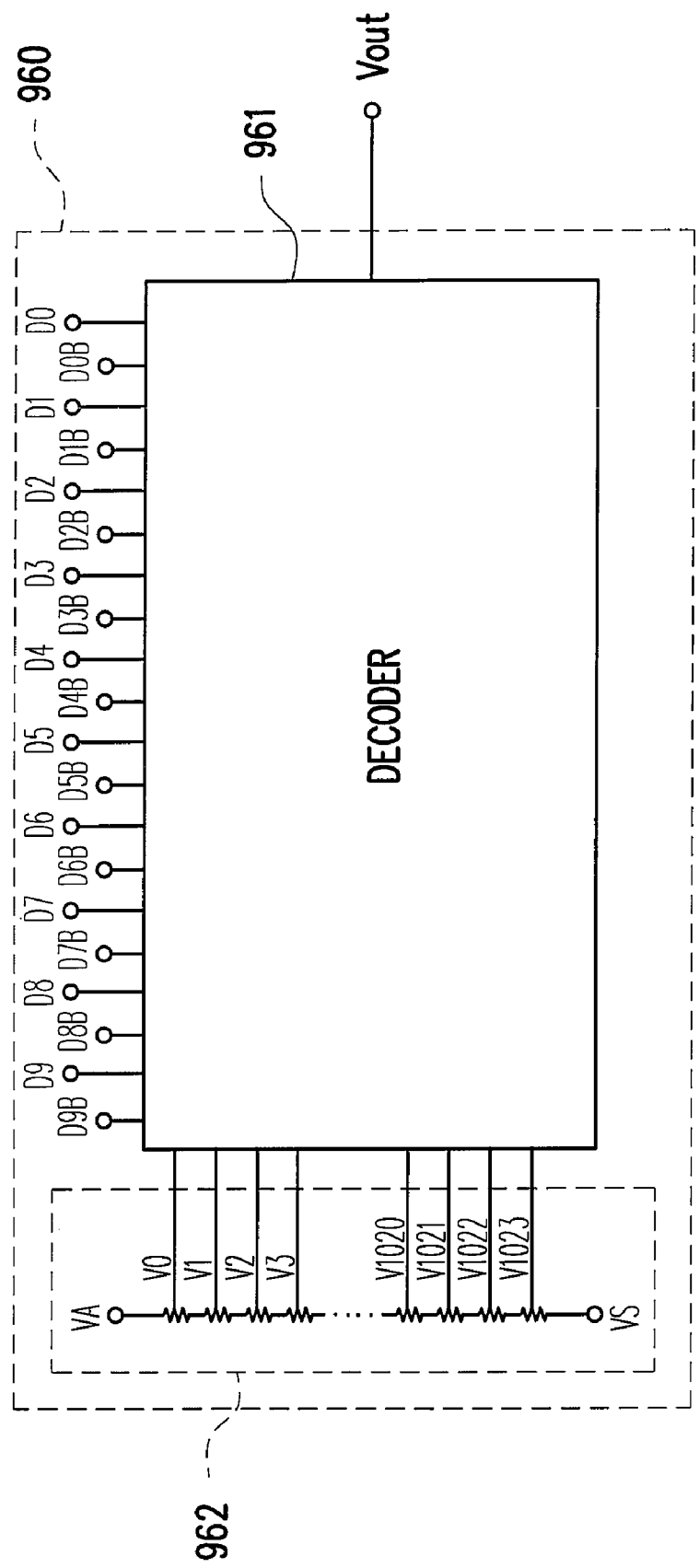
FIG. 10 shows a digital-to-analog converter configured to convert 10-bit digital data according to an embodiment of the invention.

FIG. 10 shows the digital-to-analog converter 960 configured to convert 10-bit digital data according to an embodiment of the invention. Referring to FIG. 10, the digital-to-analog converter 960 includes a gamma voltage generating circuit 962 and a decoder 961. The gamma voltage generating circuit 962 generates gamma voltages having a plurality of voltage levels, and the gamma voltages spread between the voltages levels VA and VS. The decoder 961 receives the 10-bit digital data to select one of the gamma voltages. The decoder 961 may utilize the layout structure shown in FIG. 2, FIG. 7A or FIG. 8.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A decoder for receiving a digital data and outputting an analog voltage, the decoder comprising:
   a main switch array for receiving the digital data and outputting a voltage if the digital data is in a first range, wherein the main switch array is a full-type decoder;
   a first pre-decoding switch array for receiving the digital data, pre-decoding a part of the digital data, and outputting a voltage if the digital data is in a second range, wherein each row of the first pre-decoding switch array comprises a first pre-decoding switch and a plurality of first switches, and the first pre-decoding switch is controlled by the first pre-decoded signal; and
   a second pre-decoding switch array for receiving the digital data, pre-decoding the part of the digital data, and outputting a voltage if the digital data is in a third range, wherein each row of the second pre-decoding switch array comprises a second pre-decoding switch and a plurality of second switches, and the second pre-decoding switch is controlled by the second pre-decoded signal,
   wherein combination of the main switch array, the first pre-decoding switch array and the second pre-decoding switch array is in a substantially rectangular layout structure; and
   wherein an amount of switches in each row of the main switch array is N0, an amount of the first pre-decoding switch and the first switches in each row of the first pre-decoding switch array is N1, an amount of the second pre-decoding switch and the second switches in each row of the second pre-decoding switch array is N2, and N0=N1+N2, wherein N0, N1 and N2 are positive integers.

2. The decoder of claim 1, wherein N1=N2.

3. The decoder of claim 1, wherein the main switch array is configured to select one of a plurality of first gamma voltages based on the digital data.

4. The decoder of claim 1, wherein the first pre-decoding switch array is configured to select one of a plurality of second gamma voltages based on the digital data.

5. The decoder of claim 4, wherein the first pre-decoding switch array further comprises a first pre-decoder for pre-decoding most significant bits of the digital data and providing the first pre-decoded signal.

6. The decoder of claim 1, wherein the second pre-decoding switch array is configured to select one of a plurality of third gamma voltages based on the digital data.

7. The decoder of claim 6, wherein the second pre-decoding switch array further comprises a second pre-decoder for pre-decoding most significant bits of the digital data and providing the second pre-decoded signal.

8. A source driver, comprising:
   a digital-to-analog converter, comprising:
   a decoder for receiving a digital data and outputting an analog voltage, the decoder further comprising:
   a main switch array for receiving the digital data and outputting a voltage if the digital data is in a first range, wherein the main switch array is a full-type decoder;
   a first pre-decoding switch array for receiving the digital data, pre-decoding a part of the digital data, and outputting a voltage if the digital data is in a second range, wherein each row of the first pre-decoding switch array comprises a first pre-decoding switch and a plurality of first switches, and the first pre-decoding switch is controlled by the first pre-decoded signal; and
   a second pre-decoding switch array for receiving the digital data, pre-decoding the part of the digital data, and outputting a voltage if the digital data is in a third range, wherein each row of the second pre-decoding switch array comprises a second pre-decoding switch and a plurality of second switches, and the second pre-decoding switch is controlled by the second pre-decoded signal;
   wherein combination of the main switch array, the first pre-decoding switch array and the second pre-decoding switch array is in a substantially rectangular layout structure; and
   wherein an amount of switches in each row of the main switch array is N0, an amount of the first pre-decoding switch and the first switches in each row of the first pre-decoding switch array is N1, an amount of the second pre-decoding switch and the second switches in each row of the second pre-decoding switch array is N2, and N0=N1+N2, wherein N0, N1 and N2 are positive integers.

9. The source driver of claim 8, wherein N1=N2.

10. The source driver of claim 9, wherein the main switch array of the decoder is configured to select one of a plurality of first gamma voltages based on the digital data.

11. The source driver of claim 8, wherein the first pre-decoding switch array of the decoder is configured to select one of a plurality of second gamma voltages based on the digital data.

12. The source driver of claim 11, wherein the first pre-decoding switch array of the decoder further comprises a first pre-decoder for pre-decoding most significant bits of the digital data and providing the first pre-decoded signal.

13. The source driver of claim 8, wherein the second pre-decoding switch array of the decoder is configured to select one of a plurality of third gamma voltages based one the digital data.

14. The source driver of claim 13, wherein the second pre-decoding switch array of the decoder further comprises a second pre-decoder for pre-decoding most significant bits of the digital data and providing the second pre-decoded signal.

* * * * *